United States Patent
Chen et al.

(10) Patent No.: US 9,355,980 B2
(45) Date of Patent: May 31, 2016

(54) THREE-DIMENSIONAL CHIP STACK AND METHOD OF FORMING THE SAME

(71) Applicant: Taiwan Semiconductor Manufacturing Company, Ltd., Hsin-Chu (TW)

(72) Inventors: Wei-Ming Chen, Hsin-Chu (TW); Cheng-Hsien Hsieh, Kaohsiung (TW); Sung-Hui Huang, Dongshan Township (TW); Kuo-Ching Hsu, Chung-Ho (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 103 days.

(21) Appl. No.: 14/016,966

(22) Filed: Sep. 3, 2013

(65) Prior Publication Data

US 2015/0061118 A1 Mar. 5, 2015

(51) Int. Cl.
*H01L 23/00* (2006.01)
*B23K 1/00* (2006.01)
(Continued)

(52) U.S. Cl.
CPC .............. *H01L 24/16* (2013.01); *B23K 1/0016* (2013.01); *H01L 24/05* (2013.01); *H01L 24/11* (2013.01); *H01L 24/13* (2013.01); *H01L 24/81* (2013.01); *H01L 25/0657* (2013.01); *H01L 25/50* (2013.01); *B23K 2201/40* (2013.01); *H01L 24/97* (2013.01); *H01L 2224/0345* (2013.01); *H01L 2224/03612* (2013.01); *H01L 2224/03614* (2013.01); *H01L 2224/03912* (2013.01); *H01L 2224/0401* (2013.01); *H01L 2224/05073* (2013.01); *H01L 2224/05166* (2013.01); *H01L 2224/05181* (2013.01); *H01L 2224/05187* (2013.01); *H01L 2224/05647* (2013.01); *H01L 2224/1132* (2013.01); *H01L 2224/1145* (2013.01); *H01L 2224/1147* (2013.01); *H01L 2224/11452* (2013.01); *H01L 2224/11462* (2013.01); *H01L 2224/11464* (2013.01); *H01L 2224/13023* (2013.01); *H01L 2224/13082* (2013.01); *H01L 2224/13083* (2013.01); *H01L 2224/13111* (2013.01); *H01L 2224/13118* (2013.01); *H01L 2224/13139* (2013.01); *H01L 2224/13144* (2013.01); *H01L 2224/13147* (2013.01); *H01L 2224/13155* (2013.01);
(Continued)

(58) Field of Classification Search
CPC ................................. H01L 24/11; H01L 24/16
See application file for complete search history.

(56) References Cited

U.S. PATENT DOCUMENTS 6,879,041 B2 * 4/2005 Yamamoto et al. ........... 257/737
8,803,337 B1 * 8/2014 Lin et al. ...................... 257/781
(Continued)

OTHER PUBLICATIONS

Bath, Jasbir, Lead-Free Soldering, Jul. 5, 2007, Springer US, 1st Edition, pp. 93, ISBN: 978-0023193910.*

*Primary Examiner* — Joseph C Nicely
(74) *Attorney, Agent, or Firm* — Slater Matsil, LLP (57) ABSTRACT

A three-dimensional chip stack includes a first chip bonded to a second chip to form a bonded interconnection therebetween. The bonded interconnection includes a first conductive pillar overlying a first substrate of the first chip, a second conductive pillar overlying a second substrate of the second chip, and a joint structure between the first conductive pillar and the second conductive pillar. The joint structure includes a first IMC region adjacent to the first conductive pillar, a second IMC region adjacent to the second conductive pillar, and a metallization layer between the first IMC region and the second IMC region.

20 Claims, 4 Drawing Sheets

(51) Int. Cl.
  *H01L 25/065* (2006.01)
  *H01L 25/00* (2006.01)

(52) U.S. Cl.
  CPC ............ *H01L 2224/13164* (2013.01); *H01L 2224/13169* (2013.01); *H01L 2224/13176* (2013.01); *H01L 2224/16145* (2013.01); *H01L 2224/16503* (2013.01); *H01L 2224/8181* (2013.01); *H01L 2224/81193* (2013.01); *H01L 2224/81815* (2013.01); *H01L 2224/81825* (2013.01); *H01L 2224/97* (2013.01); *H01L 2225/06513* (2013.01); *H01L 2924/1305* (2013.01); *H01L 2924/13091* (2013.01)

(56) References Cited

U.S. PATENT DOCUMENTS

| | | | |
|---|---|---|---|
| 2002/0121692 A1* | 9/2002 | Lee et al. | 257/737 |
| 2004/0023487 A1* | 2/2004 | Shiomi et al. | 438/660 |
| 2004/0094842 A1* | 5/2004 | Jimarez et al. | 257/772 |
| 2006/0292824 A1* | 12/2006 | Beyne | B81C 1/00333 438/455 |
| 2009/0297879 A1* | 12/2009 | Zeng et al. | 428/647 |
| 2010/0291399 A1* | 11/2010 | Kato | B23K 35/025 428/553 |
| 2011/0101526 A1* | 5/2011 | Hsiao et al. | 257/738 |
| 2011/0193220 A1* | 8/2011 | Kuo et al. | 257/737 |
| 2011/0227216 A1* | 9/2011 | Tseng et al. | 257/737 |
| 2011/0233761 A1* | 9/2011 | Hwang et al. | 257/737 |
| 2012/0104597 A1* | 5/2012 | Ishiduka et al. | 257/737 |
| 2012/0280384 A1* | 11/2012 | Lin et al. | 257/737 |
| 2012/0306073 A1* | 12/2012 | Yu et al. | 257/737 |
| 2013/0062750 A1* | 3/2013 | Lenniger et al. | 257/691 |
| 2013/0082091 A1* | 4/2013 | Matejat et al. | 228/176 |
| 2013/0241069 A1* | 9/2013 | Nakamura | B23K 1/0016 257/762 |
| 2014/0048942 A1* | 2/2014 | Nakamura | H01L 24/32 257/762 |
| 2014/0061287 A1* | 3/2014 | Ohnishi et al. | 228/246 |
| 2015/0061118 A1* | 3/2015 | Chen | B23K 1/0016 257/737 |

* cited by examiner

Fig. 13

THREE-DIMENSIONAL CHIP STACK AND METHOD OF FORMING THE SAME

BACKGROUND

In an attempt to further increase circuit density, three-dimensional integrated circuits (3DICs) have been investigated. In a typical formation process of a 3DIC, two chips are bonded together and electrical connections are formed between each chip and contact pads on a substrate. For example, bonding two chips may be accomplished by attaching one chip on top of the other. The stacked chips are then bonded to a carrier substrate and wire bonds electrically couple contact pads on each chip to contact pads on the carrier substrate. However, this requires a carrier substrate larger than the chips for the wire bonding. More recent attempts have focused on flip-chip interconnections and the use of conductive balls/bumps to form a connection between the chip and the underlying substrate, thereby allowing high-wiring density in a relatively small package. Traditional chip stacking using solder joints involves solder, flux and underfill. All these processes created issues and limitations on pitch, joint height, and flux residue.

DETAILED DESCRIPTION

It is to be understood that the following disclosure provides many different embodiments or examples, for implementing different features of various embodiments. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure.

FIGS. 1-4 are cross-sectional views at various stages of manufacturing a first bump structure on a first chip according to at least one embodiment.

Figure 1:
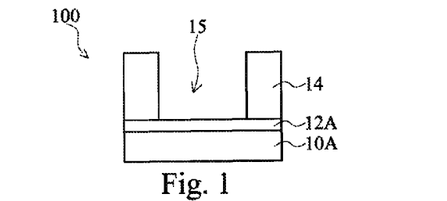
FIGS. 1-4 are cross-sectional views at various stages of manufacturing a first bump structure on a first chip according to at least one embodiment.

Referring to FIG. 1, a first chip 100 includes a first semiconductor substrate 10A employed in a semiconductor integrated circuit fabrication, and integrated circuits may be formed therein and/or thereupon. The first semiconductor substrate 10A is defined to mean any construction comprising semiconductor materials including, but not limited to, bulk silicon, a semiconductor wafer, a silicon-on-insulator (SOI) substrate, or a silicon germanium substrate. Other semiconductor materials including group III, group IV, and group V elements may also be used. The first semiconductor substrate 10A may further comprise a plurality of isolation features (not shown), such as shallow trench isolation (STI) features or local oxidation of silicon (LOCOS) features. Examples of the various microelectronic elements that may be formed in the first semiconductor substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, and other suitable types of devices. The first semiconductor substrate 10A further includes inter-layer dielectric layers (not shown) and metal lines (not shown) overlying the microelectronic elements. The inter-layer dielectric layers and the metallization structure include low-k dielectric materials, undoped silicate glass (USG), silicon nitride, silicon oxynitride, or other commonly used materials. The dielectric constants (k value) of the low-k dielectric materials may be less than about 3.9, or less than about 2.8. Metal lines in the dielectric layers may be formed of copper or copper alloys.

FIG. 1 also shows a first under-bump-metallurgy (UBM) layer 12A formed on the first semiconductor substrate 10A. In some embodiments, the first UBM layer 12A includes a stack of a first layer and second layer. The first layer, also referred to as a diffusion barrier layer or a glue layer is formed of titanium, tantalum, titanium nitride, tantalum nitride, or the like by physical vapor deposition (PVD) or sputtering. The first layer is deposited to a thickness ranging from about 500 to 2000 Angstroms and, in some embodiments for example, to a thickness of about 1000 Angstroms. The second layer is a copper seed layer formed by physical vapor deposition (PVD) or sputtering. The second layer may be formed of copper alloys that include silver, chromium, nickel, tin, gold, or combinations thereof. The second layer is deposited to a thickness ranging from about 500 to 10000 Angstroms and, in some embodiments for example, to a thickness of about 5000 Angstroms. In at least one embodiment, the first UBM layer 12A includes a Ti layer and a Cu layer.

For pillar bump formation, a mask layer 14 is provided on the first UBM layer 12A and patterned with an opening 15 for example, by exposure, development and/or etching, so that a portion of the first UBM layer 12A is exposed. In an embodiment, the mask layer 14 is a dry film, and may be formed of an organic material. In alternative embodiments, the mask layer 14 is formed of a photo resist. The thickness of the mask layer 14 may be greater than about 5 µm, or even between about 10 µm and about 120 µm.

Figure 2:
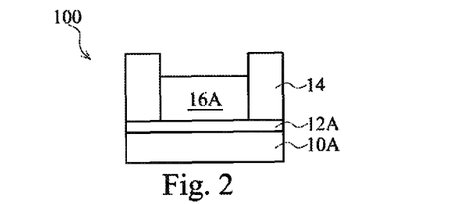

As shown in FIG. 2, the opening 15 is then partially filled with a conductive material layer, which is referred to as a first conductive pillar 16A hereinafter. The first conductive pillar 16A is formed of a conductive material with solder wettability. In an embodiment, a first conductive pillar 16A is a copper (Cu) layer which is intended to substantially include a layer comprising pure elemental copper, copper containing unavoidable impurities, and/or copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and/or commonly used chemical vapor deposition (CVD) methods. For example, electrochemical plating (ECP) is carried out to form the Cu layer. In a representative embodiment, the first conductive pillar 16A has a thickness less than about 20 μm, although the thickness may be greater or smaller. In another exemplary embodiment, the thickness of the first conductive pillar 16A is greater than 20 μm. In another exemplary embodiment, the thickness of the first conductive pillar 16A is greater than 40 μm.

Figure 2A:
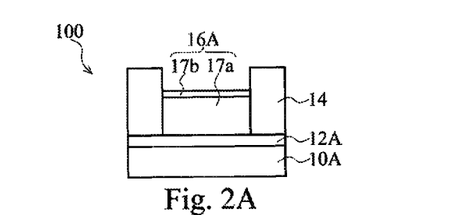

The first conductive pillar 16A is a Cu pillar in accordance with an embodiment. In some embodiments, a metal capping layer is formed on the top of the copper pillar to prevent oxidation and diffusion of copper to/from a bonding layer. FIG. 2A shows an alternative embodiment of the first conductive pillar 16A including a metal capping layer 17b on the top surface of a Cu pillar 17a within the opening 15. The metal capping layer 17b may be formed by electroplating or electroless deposition methods. The metal to be deposited is not particularly limited. The metal may be nickel (Ni), copper (Cu), silver (Ag), gold (Au), palladium (Pd), platinum (Pt), tin (Sn), zinc (Zn), Ruthenium (Ru), a noble metal, or a combination of these. In an embodiment, the metal capping layer 17b is a nickel (Ni) layer. In some embodiments, the metal capping layer 17b is a nickel alloy layer, for example nickel-palladium-gold (NiPdAu), nickel-gold (NiAu), nickel-palladium (NiPd) or other similar alloys.

Figure 3:
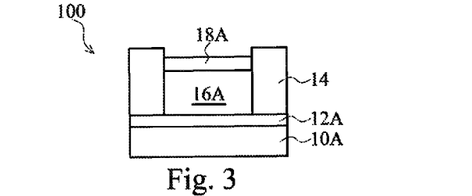

Next, as shown in FIG. 3, a first solder layer 18A is formed on the top surface of the first conductive pillar 16A. The following discussion references an embodiment such as shown in FIG. 2, but applies equally to an embodiment such as illustrated in FIG. 2A. The first solder layer 18A is made of Sn, SnAg, Sn—Pb, SnAgCu, SnAgZn, SnZn, SnBi—In, Sn—In, Sn—Au, SnPb, SnCu, SnZnIn, or SnAgSb, etc. In one embodiment, the first solder layer 18A is a lead-free solder material layer. The first solder layer 18A has a thickness less than about 10 μm. In another embodiment, the thickness of first solder layer 18A is less than or equal to about 7 μm.

Figure 4:
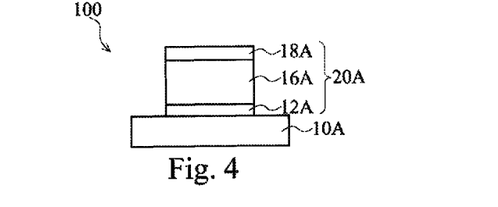

Next, as shown in FIG. 4, the mask layer 14 is removed, and then the uncovered portion of the first UBM layer 12A is etched. In the case of the mask layer 14 comprising a dry film, it may be removed using an alkaline solution. Thereafter, the exposed portion of the first UBM layer 12A is etched back using the resulting structure (including layers 16A and 18A) as a mask by a wet and/or dry etching process, depending on the metallurgy of the UBM material. The resulting structure is a first bump structure 20A including the first UBM layer 12A, the first conductive pillar 16A, and the first solder layer 18A in accordance with an embodiment. After the bump formation, the first chip 100 may be bonded to another chip through chip-to-wafer level stacking or chip-to-chip level stacking or the like. It should be noted, however, that embodiments may be used in many different situations. For example, embodiments may be used in a chip-to-chip bonding configuration, a chip-to-wafer bonding configuration, chip-level packaging, or the like.

Figure 5:
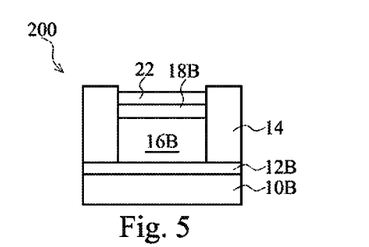
FIGS. 5-6 are cross-sectional views at various stages of manufacturing a second bump structure on a second chip according to at least one embodiment.
Figure 6:
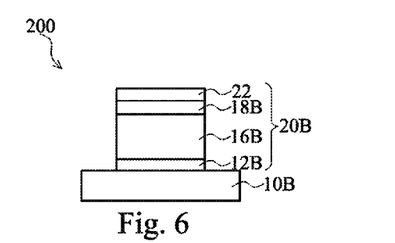

FIGS. 5-6 are cross-sectional views at various stages of manufacturing a second bump structure on a second chip according to at least one embodiment.

Referring to FIG. 5, a second chip 200 includes a second semiconductor substrate 10B, a second UBM layer 12B formed on the second semiconductor substrate 10B, a mask layer 14 patterned on the second UBM layer 12B, a second conductive pillar 16B formed in the opening of the mask layer 14, and a second solder layer 18B formed on the top of the second conductive pillar 16B. Any suitable process and materials may be used to form the structures in the second chip 200, and those may be similar to or the same as the formation in the first chip 100. In at least one embodiment, processes and materials used to form the elements 10B, 12B, 14, 16B and 18B of the second chip 200 may be similar to or the same as the formation of elements 10A, 12A, 14, 16A and 18A of the first chip 100.

FIG. 5 also shows the formation of a metallization layer 22 on the top of the second solder layer 18B. The metallization layer 22 may be formed of a material highly reactive with solder material. In an embodiment, the metallization layer 22 is a Cu layer which is intended to substantially include a layer comprising pure elemental copper, copper containing unavoidable impurities, and/or copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and/or commonly used deposition methods. In one embodiment, the metallization layer 22 has a thickness less than about 10 μm. In another embodiment, the thickness of metallization layer 22 is less than or equal to about 5 μm.

Next, as shown in FIG. 6, the mask layer 14 is removed, and then the uncovered portion of the second UBM layer 12B is etched. The resulting structure is a second bump structure 20B including the second UBM layer 12B, the second conductive pillar 16B, the second solder layer 18B and the metallization layer 22 in accordance with an embodiment. After the bump formation, the second chip 200 may be bonded to the first chip 100 through chip-to-wafer level stacking or chip-to-chip level stacking or the like.

FIGS. 7-10 are cross-sectional views at various stages of bonding the first chip and the second chip by attaching the first bump structure to the second bump structure according to various embodiments.

Figure 7:
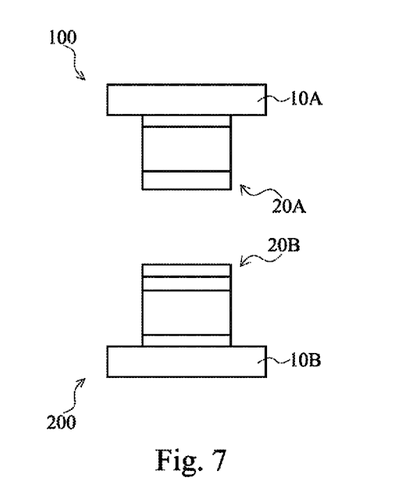
FIGS. 7-10 are cross-sectional views at various stages of bonding the first chip and the second chip by attaching the first bump structure to the second bump structure according to various embodiments.
Figure 8:
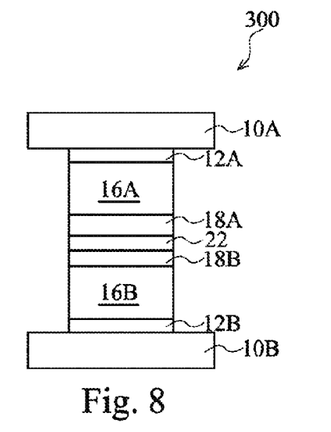
Figure 9:
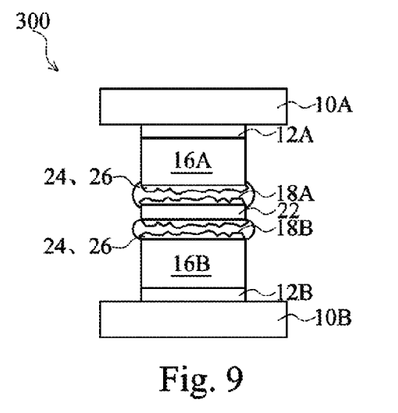
Figure 10:
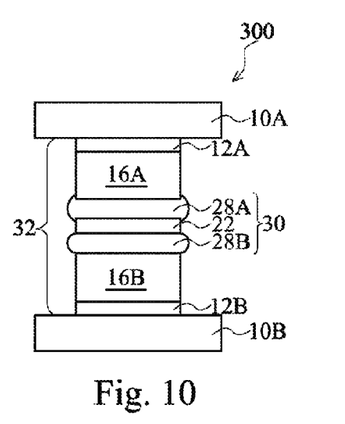

As shown in FIG. 7, in an embodiment of utilizing flip-chip bonding, the first chip 100 is flipped down toward the second chip 200 such that the first bump structure 20A faces the second bump structure 20B. Then a bonding process is performed to bond the first chip 100 and the second chip 200 by attaching the first bump structure 20A to the second bump structure 20B, and therefore a 3D chip stack 300 is formed through jointing the first solder layer 18A and the metallization layer 22 as shown in FIG. 8. In an embodiment, the bonding process uses a solid liquid interdiffusion (SLID) technology. In an example of Cu/Sn binary metal system, SLID technology is based on the rapid intermetallic formation between a high-melting point component (for example, Cu in the metallization layer 22) and a low melting point component (for example, Sn in the first solder layer 18A) at the temperature above the melting point of Sn. As heat and pressure are applied, Sn is melted but Cu still remains in solid phase. Solid liquid inter-diffusion occurs between the two phases, resulting in a phase transformation of the liquid component to an intermetallic compound (IMC), which is strong enough to serve as a bond and withstand elevated temperatures. When the temperature is raised to the melting point of Sn, the interdiffusion process is accelerated and the thickness of IMC increases rapidly. As depicted in FIG. 9, solidification occurs upon diffusion and reaction, and a first intermetallic phase 24 (for example, $Cu_6Sn_5$) is initially developed in the solder layers 18A and 18B at the processing temperature of 250~300° C. As the interdiffusion continues, a second intermetallic phase 26 (for example, $Cu_3Sn$) starts and finally becomes the fully IMC phase present in a first IMC region 28A between the metallization layer 22 and the first conductive pillar 16A as shown in FIG. 10. The SLID process also forms a second IMC region 28B with the fully IMC phase between the metallization layer 22 and the second conductive pillar 16B because of diffusion and reaction of Cu and Sn in the second solder layer 18B. In an embodiment, the fully found IMC phase includes Cu and Sn having reached a thermodynamic equilibrium and having long-term stability in accordance with an embodiment. The first IMC region 28A has a thickness greater than or equal to about 0.5 μm. For example, the first IMC region 28A has a thickness greater than or equal to about 1 μm. In alternative embodiments of forming the conductive pillar 16A or 16B with the metal capping layer 17b, Sn tends to reacts with metals (for example, Ni) in the metal capping layer 17b during the thermal reflow process, and thus the IMC phase in the regions 28A and/or 28B includes Cu, Sn and metal of the metal capping layer 17b. For example, the IMC phase includes Cu, Sn and Ni.

The bonding process results in the 3D chip stack 300 with a bonded interconnection 32 that includes the first UBM layer 12A and the first conductive pillar 16A of the first chip 100, the second UBM layer 12B and the second conductive pillar 16B of the second chip 200, and a joint structure 30 between the first conductive pillars 16A and 16B. The joint structure 30 includes the first IMC region 28A, the second IMC region 28B and the metallization layer 22 between the IMC regions 28A and 28B. The metallization layer 22 can increase the solid-liquid interdiffusion interfaces so as to fulfill the SLID process, and therefore the solder migration phenomenon observed in high temperature storage (HTS) test is eliminated and defect issues (such as opened bumps) are solved. The present embodiments of utilizing the metallization layer 22 can greatly improve the reliable performance of the bonded interconnection 32 in the 3D chip stack 300.

Figure 11:
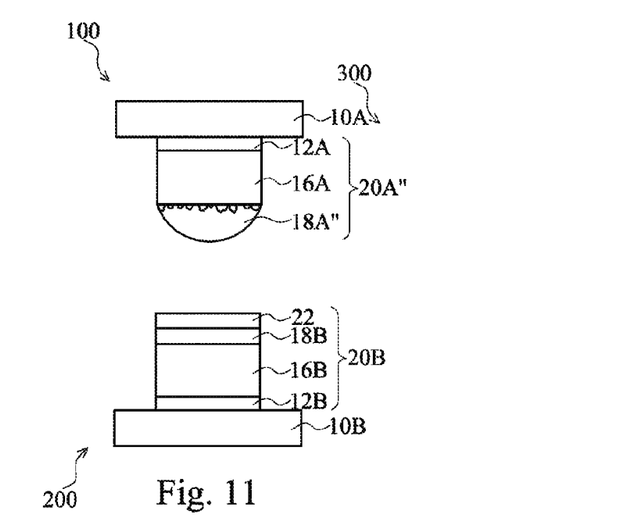
FIGS. 11-13 are cross-sectional views at various stages of bonding the first chip and the second chip by attaching the first bump structure with a hemisphere-shaped solder layer to the second bump structure according to at least one embodiment.
Figure 12:
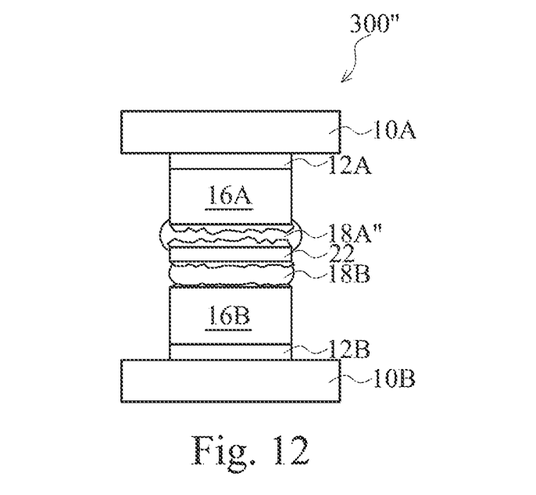
Figure 13:
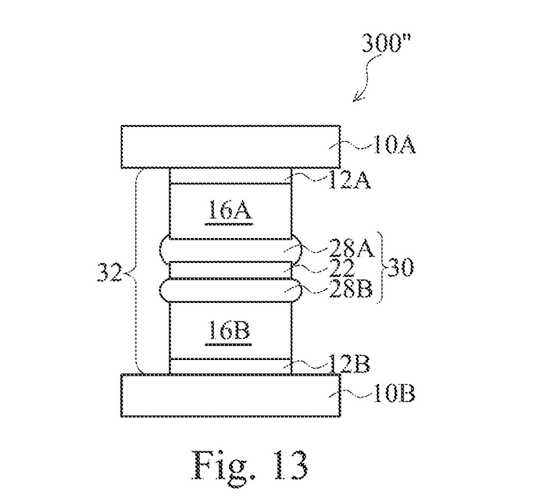

Some embodiments of the present disclosure relate to performing a thermal reflow process on the first solder layer 18A before bonding the chips 100 and 200, and such methods of forming the 3D chip stack will be described herein. FIGS. 11-13 are cross-sectional views at various stages of bonding the first chip and the second chip by attaching the first bump structure with a hemisphere-shaped solder layer to the second bump structure according to at least one embodiment, wherein like reference numerals refer to like elements.

With reference to FIG. 11, the formation of the first bump structure 20A" of the first chip 100 includes performing a thermal reflow process to melt the first solder layer 18A to form a hemisphere-shaped solder layer 18A", for example, either through heating or rapid thermal processing (RTP). During the thermal reflow process, Sn in the first solder layer 18A tends to react with Cu and or Ni in the first conductive pillar 16A to form an IMC phase therebetween. In an embodiment of utilizing flip-chip bonding, the first chip 100 is flipped down toward the second chip 200 such that the first bump structure 20A" faces the second bump structure 20B.

Then as shown in FIG. 12, a bonding process is performed to bond the first chip 100 and the second chip 200 by attaching the first bump structure 20A" to the second bump structure 20B, and therefore a 3D chip stack 300" is formed through joining the hemisphere-shaped solder layer 18A" and the metallization layer 22. In an embodiment, the bonding process uses a SLID technology with a Cu/Sn binary metal system. In some embodiments, intermetallic phases 24 and/or 26 are developed in the solder layers 18A" and 18B, and finally becomes the fully formed IMC phase present in a first IMC region 28A between the metallization layer 22 and the first conductive pillar 16A, as shown in FIG. 13. The SLID process also forms a second IMC region 28B with the fully formed IMC phase between the metallization layer 22 and the second conductive pillar 16B because of diffusion and reaction of Cu and Sn in the second solder layer 18B. In an embodiment, the fully formed IMC phase includes Cu and Sn. In alternative embodiments, the fully formed IMC phase includes Cu, Sn and Ni. The bonding process results in the 3D chip stack 300" with a bonded interconnection 32 that includes the first UBM layer 12A and the first conductive pillar 16A of the first chip 100, the second UBM layer 12B and the second conductive pillar 16B of the second chip 200, and a joint structure 30 between the first conductive pillars 16A and 16B. The joint structure 30 includes the first IMC region 28A, the second IMC region 28B and the metallization layer 22 between the IMC regions 28A and 28B.

According to some embodiments, a three-dimensional chip stack includes a first chip having a first substrate and a second chip having a second substrate. The first chip is bonded to the second chip to form a bonded interconnection between the first substrate and the second substrate. The bonded interconnection includes a first conductive pillar overlying the first substrate, a second conductive pillar overlying the second substrate, and a joint structure between the first conductive pillar and the second conductive pillar. The joint structure includes a first IMC region adjacent to the first conductive pillar, a second IMC region adjacent to the second conductive pillar, and a metallization layer between the first IMC region and the second IMC region.

According to some embodiments, a method of forming a three-dimensional chip stack, includes steps of: forming a first bump structure on a first semiconductor substrate, wherein the first bump structure includes a first conductive pillar and a first solder layer on the top of the first conductive pillar; forming a second bump structure on a second semiconductor substrate, wherein the second bump structure includes a second conductive pillar, a second solder layer on the top of the second conductive pillar, and a metallization layer on the second solder layer; attaching the first bump structure to the second bump structure; and performing a thermal reflowing process to form a first IMC region between the first conductive pillar and the metallization layer, and a second IMC region between the second conductive pillar and the metallization layer.

According to some embodiments, a method of forming a three-dimensional chip stack, includes steps of: receiving a first chip including a first bump structure formed on a first semiconductor substrate, wherein the first bump structure includes a first conductive pillar and a first solder layer on the top of the first conductive pillar; receiving a second chip including a second bump structure on a second semiconductor substrate, wherein the second bump structure includes a second conductive pillar, a second solder layer on the top of the second conductive pillar, and a metallization layer on the second solder layer; and bonding the first chip to the second chip by attaching the first bump structure to the second bump structure. A first IMC region includes copper and tin formed between the first conductive pillar and the metallization layer, and a second IMC region includes copper and tin formed between the second conductive pillar and the metallization layer.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiments show representative steps, but they are not necessarily required to be performed in the order shown. Steps may be added, replaced, changed in order, and/or eliminated as appropriate, in accordance with the spirit and scope of embodiments of the disclosure. Embodiments that combine different claims and/or different embodiments are within the scope of the disclosure and will be apparent to those skilled in the art after reviewing this disclosure.

What is claimed is:

1. A three-dimensional chip stack, comprising:
   a first chip comprising a first substrate;
   a first conductive pillar overlying the first substrate;
   a second chip comprising a second substrate;
   a second conductive pillar overlying the second substrate; and
   a metallization layer between the first conductive pillar and the second conductive pillar, the metallization layer having a first surface and a second surface;
   wherein the first chip is bonded to the second chip to form a bonded interconnection between the first substrate and the second substrate,
   wherein the bonded interconnection comprises a first joint structure between the first conductive pillar and the first surface of the metallization layer, and a second joint structure between the second conductive pillar and the second surface of the metallization layer;
   wherein the first joint structure comprises a first intermetallic compound (IMC) and the second joint structure comprises a second IMC; and
   wherein the metallizaton layer has a higher melting point than the first joint structure or the second joint structure.

2. The three-dimensional chip stack of claim 1, wherein the metallization layer comprises at least one of copper or a layer of elemental copper.

3. The three-dimensional chip stack of claim 1, wherein at least one of the first IMC or the second IMC comprises copper and tin.

4. The three-dimensional chip stack of claim 1, wherein:
   the metallization layer comprises a first material having a first melting point;
   the first IMC comprises a second material having a second melting point, the second melting point lower than the first melting point; and
   the second IMC comprises a third material having a third melting point, the third melting point lower than the first melting point.

5. The three-dimensional chip stack of claim 1, wherein the first conductive pillar comprises a copper pillar.

6. The three-dimensional chip stack of claim 5, wherein the first conductive pillar comprises a metal capping layer on the copper pillar.

7. The three-dimensional chip stack of claim 6, wherein the metal capping layer comprises a nickel layer.

8. The three-dimensional chip stack o of claim 7, wherein the first IMC region comprises copper, tin and nickel.

9. The three-dimensional chip stack of claim 1, wherein the second conductive pillar comprises a copper pillar.

10. The three-dimensional chip stack of claim 9, wherein the second conductive pillar comprises a metal capping layer on the copper pillar.

11. The three-dimensional chip stack of claim 10, wherein the metal capping layer comprises a nickel layer.

12. The three-dimensional chip stack o of claim 11, wherein the second IMC region comprises copper, tin and nickel.

13. A method of forming a three-dimensional chip stack, the method comprising:
    forming a first bump structure on a first semiconductor substrate, wherein the first bump structure comprises a first conductive pillar and a first solder layer on top of the first conductive pillar;
    forming a second bump structure on a second semiconductor substrate, wherein the second bump structure comprises a second conductive pillar, a second solder layer on top of the second conductive pillar, and a metallization layer on the second solder layer;
    attaching the first bump structure to the second bump structure; and
    performing a thermal reflow process to form a first joint structure comprising a first intermetallic compound (IMC) region between the first conductive pillar and a first surface of the metallization layer, and a second joint structure comprising a second IMC region between the second conductive pillar and a second surface of the metallization layer, wherein the metallization layer has a higher melting point than the first IMC or the second IMC.

14. The method of claim 13, wherein the metallization layer comprises a copper layer, and the first IMC region comprises copper and tin.

15. The method of claim 13, wherein the first conductive pillar comprises a copper pillar.

16. The method of claim 15, wherein the first conductive pillar comprises a metal capping layer between the copper pillar and the first solder layer.

17. The method of claim 16, wherein the metal capping layer comprises a nickel layer.

18. The method of claim 13, further comprising forming the first solder layer as a hemisphere-shaped solder layer before attaching the first bump structure to the second bump structure.

19. A method of forming a three-dimensional chip stack, the method comprising:
    receiving a first chip comprising a first bump structure formed on a first semiconductor substrate, wherein the first bump structure comprises a first conductive pillar and a first solder layer on top of the first conductive pillar;
    receiving a second chip comprising a second bump structure on a second semiconductor substrate, wherein the second bump structure comprises a second conductive pillar, a second solder layer on top of the second conductive pillar, and a metallization layer on the second solder layer, the metallization layer having a higher melting point than that of the first solder layer or the second solder layer; and
    bonding the first chip to the second chip by attaching the first bump structure to the second bump structure, wherein a first joint structure comprising a first intermetallic compound (IMC) region comprising copper and tin is formed between the first conductive pillar and the first surface of the metallization layer, and a second joint structure comprising a second IMC region comprising copper and tin is formed between the second conductive pillar and a second surface of the metallization layer.

20. The method of claim 19, wherein the metallization layer comprises a copper layer.

* * * * *